United States Patent
Göthe et al.

(10) Patent No.: US 10,934,617 B2
(45) Date of Patent: Mar. 2, 2021

(54) METAL COATING OF OBJECTS USING PLASMA POLYMERISATION PRETREATMENT

(75) Inventors: Sven Göthe, Bromma (SE); Björn Atthoff, Uppsala (SE); Karl-Gunnar Larsson, Kalix (SE)

(73) Assignee: CUPTRONIC TECHNOLOGY LTD., Limassol (CY)

( * ) Notice: Subject to any disclaimer, the term of this patent is extended or adjusted under 35 U.S.C. 154(b) by 574 days.

(21) Appl. No.: 13/885,616

(22) PCT Filed: Nov. 16, 2011

(86) PCT No.: PCT/EP2011/070213
§ 371 (c)(1),
(2), (4) Date: Oct. 3, 2013

(87) PCT Pub. No.: WO2012/066018
PCT Pub. Date: May 24, 2012

(65) Prior Publication Data
US 2014/0017575 A1   Jan. 16, 2014

Related U.S. Application Data

(60) Provisional application No. 61/414,116, filed on Nov. 16, 2010.

(30) Foreign Application Priority Data

Nov. 16, 2010   (SE) .................... 1051201-0

(51) Int. Cl.
| | | |
|---|---|---|
| *C23C 16/02* | (2006.01) | |
| *C23C 18/16* | (2006.01) | |
| *C23C 18/18* | (2006.01) | |
| *H05K 3/38* | (2006.01) | |
| *H01M 4/88* | (2006.01) | |
| *B05D 1/00* | (2006.01) | |
| *C23C 18/20* | (2006.01) | |
| *H01L 31/04* | (2014.01) | |
| *H01M 8/02* | (2016.01) | |
| *H05K 1/02* | (2006.01) | |

(52) U.S. Cl.
CPC ............ *C23C 16/0272* (2013.01); *B05D 1/62* (2013.01); *C23C 18/1601* (2013.01); *C23C 18/165* (2013.01); *C23C 18/1651* (2013.01); *C23C 18/1803* (2013.01); *C23C 18/1834* (2013.01); *C23C 18/2006* (2013.01); *C23C 18/2013* (2013.01); *C23C 18/2086* (2013.01); *H01L 31/04* (2013.01); *H01M 4/886* (2013.01); *H01M 4/8825* (2013.01); *H01M 8/02* (2013.01); *H05K 1/02* (2013.01); *H05K 3/387* (2013.01); *C23C 18/1851* (2013.01); *H05K 2203/095* (2013.01); *H05K 2203/1168* (2013.01); *Y10T 428/12063* (2015.01); *Y10T 428/12396* (2015.01); *Y10T 428/12493* (2015.01)

(58) Field of Classification Search
CPC ..... B05D 1/62; C23C 18/1601; C23C 18/165; C23C 18/1651; C23C 18/1803; C23C 18/1834; C23C 18/2006; C23C 18/2013; C23C 18/2086; H01M 4/8825; H01M 4/886; H05K 3/03
See application file for complete search history.

(56) References Cited

U.S. PATENT DOCUMENTS

| | | | |
|---|---|---|---|
| 5,962,138 A | 10/1999 | Kolluri | |
| 6,106,904 A | 8/2000 | Strotmann | |
| 2009/0155553 A1 | 6/2009 | Nagasaki | |
| 2009/0205853 A1* | 8/2009 | Larsson | ............... C23C 18/1605 174/256 |

FOREIGN PATENT DOCUMENTS

| | | |
|---|---|---|
| DE | 10248085 | 5/2004 |
| WO | 2007116057 | 10/2007 |

OTHER PUBLICATIONS

PCT International Preliminary Report on Patentability from PCT/EP2011/070213, dated May 21, 2013.
PCT Written Opinion from PCT/EP2011/070213, dated Aug. 20, 2012.
International Search Report from PCT/EP2011/070213 dated Aug. 20, 2012.
Written Opinion from PCT/EP2011/070213 dated Aug. 20, 2012.

* cited by examiner

*Primary Examiner* — Robert S Walters, Jr.
(74) *Attorney, Agent, or Firm* — Porter Wright Morris & Arthur LLP

(57) ABSTRACT

A method for applying a metal on a substrate comprises: a) applying a coating by treatment in a plasma, comprising a compound selected from alkanes up to 10 carbon atoms, and unsaturated monomers, and b1) producing polymers on the surface of the substrate, the polymers comprising carboxylic groups and adsorbed ions of a second metal, reducing the ions to the second metal, or alternatively b2) producing polymers on the surface, bringing the surface of the substrate in contact with a dispersion of colloidal metal particles of at least one second metal, and c) depositing the first metal on the second metal. Advantages include that materials sensitive to, for instance, low pH or solvents can be coated. Substrates including glass, $SiO_2$ with very few or no abstractable hydrogen atoms as well as polymer materials containing halogen atoms can be coated with good adhesion.

11 Claims, No Drawings

METAL COATING OF OBJECTS USING PLASMA POLYMERISATION PRETREATMENT

CROSS-REFERENCE TO RELATED APPLICATIONS

This application is the U.S. national phase entry of PCT/EP2011/070213, with an international filing date of 16 Nov. 2011, which claims the benefit of Swedish patent application no. 1051201-0, with a filing date of 16 Nov. 2010 and U.S. patent application No. 61/414,116, with a filing date of 16 Nov. 2010, the entire disclosures of which are fully incorporated herein by reference.

TECHNICAL FIELD

The present invention relates generally to a method for the application of a metal on a substrate as well as an object coated with the method.

BACKGROUND

WO 98/34446 discloses a method to apply conducting materials in distinct patterns on organic substrates, the surface layer is chemically modified to achieve distinct adhesion areas according to said distinct pattern, where after conducting material is applied to these areas.

WO 2007/116056 discloses a method for applying a metal on a substrate, comprising: a) producing polymers on the surface of the substrate, where the polymers comprise carboxylic groups and adsorbed ions of at least one other metal, b) reducing the ions to the second metal and c) depositing the first metal on the reduced ions. Plasma treatment is mentioned as in an initial step in order to improve the wetting of the subsequent solutions that are applied to the surface, and as a cleaning step.

WO 2007/116057 discloses the above process applied to paper.

WO 00/20656 discloses a method for applying metal on a solid polymer substrate comprising: a) generating radicals on the substrate surface by subjecting it to a gas plasma, b) forming a layer on the surface using a plasma enhanced polymerisation process, c) providing a short surface deposition using a PVD or CVD process to deposit metal atoms, and d) optionally providing a metallization of the surface by using a conventional electroless bath.

For methods using CVD and/or PVD it is a problem how to increase the adhesion of the metal layer.

U.S. Pat. No. 6,383,575 discloses a method for the production of a metal film on a solid substrate which involves coating a substrate surface with a metal precursor and reducing said metal precursor by means of non-equilibrium plasma treatment, said plasma treatment effectively reducing the metal precursor to the corresponding metal. There is also disclosed an embodiment where a substrate is non-wettable towards the metal precursor solution (e.g. a PTFE substrate), then a plasma polymer coupling layer (e.g. maleic anhydride, allylamine, acrylic acid, etc.) can first be deposited to improve the adhesion of the metal precursor to the substrate. The metal precursor can then be deposited onto this plasma polymer layer and subsequently reduced. Examples of metal precursor are organometallic compounds, metallorganic compounds and salts of suitable metals.

Although the method disclosed in the publications WO 2007/116056 and WO 2007/116057 involving producing polymers with carboxylic groups and adsorbed ions of a, can be used to apply a metal layer on most substrates with excellent adhesion, it has turned out that regarding some substrates there is room for an improvement. The technology described in the above publications works excellent if there are hydrogen atoms in the substrate material which can be abstracted. Substrates which are sensitive to the solutions which are used in the above described processes may be difficult to coat with metal. An example is Polycarbonate/Acrylonitrile Butadiene Styrene (PC/ABS) plastics which is sensitive to solutions with low pH and high pH. Moreover halogen polymers as well as polymers without or with very few abstractable hydrogen atoms may be less suitable to coat according to the state of the art. Further glass and ceramic materials may be difficult to coat.

SUMMARY

It is an object of the present invention to alleviate at least some of the disadvantages of the prior art and to provide an improved method which improves the adhesion and which allows a wider range of substrates to be coated with good adhesion.

In a first aspect there is provided a method for at least partially applying a first metal on the surface of a substrate comprising the steps:
a) applying a coating by treating said substrate in a plasma, said plasma comprising at least one compound selected from alkanes up to 10 carbon atoms, and unsaturated monomers, performing one of the steps b1 and b2,
b1) producing polymers on the surface of said substrate, said polymers comprising carboxylic groups and adsorbed ions of at least one second metal, reducing said ions to the second metal,
b2) producing polymers on the surface of said substrate, said polymers comprising carboxylic groups, bringing the surface of said substrate in contact with at least one dispersion of colloidal metal particles of at least one second metal, wherein said particles have a diameter in the range 5-500 nm,
c) depositing said first metal on said second metal.

In a second aspect there is provided an object manufactured by the described method.

Further embodiments are detailed in the description and in the dependent claims.

Advantages of the invention include that substrates such as PC/ABS which are sensitive to for instance low pH/high pH or other properties of the solutions used can be coated with metal, because the applied thin coating of plasma-polymerized material acts as a protective barrier. A further advantage is that substrates with very few (epoxy resins) of no abstractable hydrogen atoms can be coated, since the applied thin coating of plasma-polymerized material has abstractable hydrogen atoms. Also polymer materials containing halogen atoms like bromine which partly deactivate the grafting process can be used. A further advantage is that inorganic materials including but not limited to glass, $SiO_2$ can be used a substrate and successfully coated.

DETAILED DESCRIPTION

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

If nothing else is defined, any terms and scientific terminology used herein are intended to have the meanings commonly understood by those of skill in the art to which this invention pertains.

The term "about" as used in connection with a numerical value throughout the description and the claims denotes an interval of accuracy, familiar and acceptable to a person skilled in the art. Said interval is ±10%.

As used throughout the claims and the description, the term plasma denotes a distinct phase of matter, a collection of charged particles that respond strongly and collectively to electromagnetic fields, taking the form of gas-like clouds or ion beams. Since the particles in plasma are electrically charged (generally by being stripped of electrons), it is frequently described as an "ionized gas.

In a first aspect there is provided a method for at least partially applying a first metal on the surface of a substrate comprising the steps:
a) applying a coating by treating said substrate in a plasma, said plasma comprising at least one compound selected from alkanes up to 10 carbon atoms, and unsaturated monomers, performing one of the steps b1 and b2,
b1) producing polymers on the surface of said substrate, said polymers comprising carboxylic groups and adsorbed ions of at least one second metal, reducing said ions to the second metal,
b2) producing polymers on the surface of said substrate, said polymers comprising carboxylic groups, bringing the surface of said substrate in contact with at least one dispersion of colloidal metal particles of at least one second metal, wherein said particles have a diameter in the range 5-500 nm,
c) depositing said first metal on said second metal.

The plasma creates a thin coating layer (plasma polymers). In this invention plasma is utilized to apply a coating. In the plasma a polymerization reaction occurs giving a polymerized coating comprising polymers which are built up by the monomers present in the plasma gas. The thickness of the plasma polymerization layer can vary. In one embodiment the thickness of one plasma polymerization layer is from 2 nm to 50 nm. The monomers in the gas can be of one type giving a homogenous polymer. Alternative there is a mixture of monomers in the gas giving a heterogenous polymer.

In one embodiment a second metal is applied to the surface by producing polymers on the surface of said substrate, said polymers comprising carboxylic groups and adsorbed ions of at least one second metal, and thereafter reducing said ions to the second metal. This is referred to as step b1.

Alternatively a second metal is applied to the surface by producing polymers on the surface of said substrate, said polymers comprising carboxylic groups, and subsequently bringing the surface of said substrate in contact with at least one dispersion of colloidal metal particles of at least one second metal, wherein said particles have a diameter in the range 5-500 nm. The second metal is in this embodiment deposited from the colloidal dispersion of small particles of the second metal. This is referred to as step b2.

Either step b1 is performed or step b2 is performed. Both the method with step b1 and with step b2 are encompassed as separate methods as well.

The plasma polymerization coating can be med in several ways. Examples of plasma polymerization coatings include but are not limited to
1-layer of plasma polymerized coating that consists of one compound
1-layer of plasma polymerized coating that consists of two or more compounds
2- or more layers of plasma polymerized coating where each layer consists of one compound
2- or more layers of plasma polymerized coating where each layer consists of two or more compounds
2- or more layers of plasma polymerized coating where each layer consists either of one compound or two/more compounds.

In one embodiment the plasma comprises at least one compound selected from alkenes, alkynes, acrylics, methacrylics, ammonia, amines, (including primary, secondary, and tertiary), isocyanates, norbornene, allylethers, and vinylethers.

In one embodiment the plasma comprises at least one compound selected from alkenes, acrylics, allylethers, vinylethers and norbornene.

In one embodiment the plasma comprises propane.

In one embodiment the plasma further comprises at least one compound selected from oxygen, nitrogen or argon.

In one embodiment the polymers are produced on said surface by contacting said surface with a) at least one type of monomer, of which at least one comprises a carboxylic group, b) ions or a dispersion of colloidal metal particles having a diameter in the range 5-500 nm of at least one second metal selected from the group consisting of ruthenium, rhodium, palladium, osmium, iridium, platinum and copper, and c) at least one initiator.

In an alternative embodiment the polymers are produced on said surface by contacting said surface with a) at least one type of monomer, of which at least one comprises a carboxylic group, and b) at least one initiator, and thereafter contacting said surface with a solution comprising ions or a dispersion of colloidal metal particles having a diameter in the range 5-500 nm of at least one second metal selected from the group consisting of ruthenium, rhodium, palladium, osmium, iridium, platinum and copper.

In one embodiment the at least one type of monomer is selected from the group consisting of acrylic acid and methacrylic acid.

In yet an alternative embodiment the polymers are produced on said surface by contacting said surface with a) at least one type of monomer, of which at least one comprises a latent carboxylic group, and b) at least one initiator, and thereafter subjecting said surface to conditions suitable for transforming the latent carboxylic groups into carboxylic groups, and thereafter contacting said surface with a solution comprising ions or a dispersion of colloidal metal particles having a diameter in the range 5-500 nm of at least one second metal selected from the group consisting of ruthenium, rhodium, palladium, osmium, iridium, platinum and copper. In one embodiment the monomer comprising a latent carboxylic group is at least one substance selected from the group consisting of tert-butyl acrylate, maleic anhydride, methacrylic anhydride and acrylic anhydride. In one embodiment the conditions suitable for transforming the latent carboxylic groups into carboxylic groups, are achieved by contacting the surface with a photo induced Brönsted acid. In one embodiment the Brönsted acid is selected from the group consisting of a sulfonium salt and an iodonium salt.

A latent carboxylic group refers to a chemical group which has the ability to undergo a chemical reaction to form a carboxylic group.

In one embodiment the initiator is selected from the group consisting of thioxantone, thioxantone derivatives, camphorquinone, benzophenone, 4-chloro benzophenone, 4,4' dichloro benzophenone, 4-benzyl benzophenone, benzoyl naphthalene, xanthone, anthraquinone, 9-fluorenone, acetophenone, benzoyl dimethylketal, hydroxy-cyclo-hexyl-acetophenone, bi-acetyl, 3,4-hexane-di-one, 2,3-pentane-di-one, 1-phenyl-1,2-propane-di-one, benzene, benzoylformic acid, formaldehyde, acetic aldehyde, acetone, 2-pentanone, 3-pentanone, cyclohexanone, methanol sulphonate esters of benzophenone and mixtures thereof.

In one embodiment the second metal is palladium.

In one embodiment the method further comprises use of ammonium ions. In one embodiment ammonium ions are in the same solution as the palladium ions. The skilled person realizes that suitable counter ions are present in a solution comprising ions.

In one embodiment the ions are adsorbed at a pH above 7. In an alternative embodiment the ions are adsorbed at a pH above 10.

In one embodiment the first metal is selected from the group consisting of copper, silver, gold, nickel, titanium, and chromium.

In one embodiment the surface is further subjected to the steps of e) selectively depositing a third metal to said surface in a distinct pattern, and f) removing said first and second metal from said surface on the parts which are not covered by said third metal. In one embodiment the metal is applied in a distinct pattern on said substrate. In one embodiment the metal is applied on the entire substrate. In one embodiment the third metal is copper.

In a second aspect there is provided an object comprising a substrate manufactured as described above. All embodiments and features relating to the method for applying metal, are also applicable to the object comprising the substrate.

In one embodiment the thickness of the layer of said first metal is from about 0.2 μm to about 30 μm. In an alternative embodiment the thickness of the layer of said first metal is from about 0.2 μm to about 10 μm.

The applications of metal coated objects are numerous in many different fields. Here non limiting examples of some applications are given. In one embodiment the object comprises a circuit. In one embodiment the object is a printed wire board. In one embodiment the object is an antenna intended for radio frequent electromagnetic waves. In one embodiment the object is an antenna for telecommunication. In one embodiment the object is a fuel cell. In one embodiment the object is a solar cell. In one embodiment the object is a light reflector. In one embodiment the object is an automotive light reflector.

In one embodiment the object comprises more than one layer of conductors, which conductors are electrically insulated from each other. There is provided the possibility to form a circuit in several layers by applying several layers of conductive metal with insulating material in between.

EXAMPLES

Example 1

Five different polymeric substrates, with size: 8×8 cm, were plasma-coated: 1) Polyclad®, an epoxy based material, 2) Panasonic Halogen-free Glass Epoxy Multi-layer Materials Laminate R-15660®, which comprises an epoxy matrix, 3) PC/ABS (Polycarbonate/Acrylonitrile Butadiene Styrene), and 4) GX13, Ajinomoto Build-up Film ABF-GX13®, comprising particles in an epoxy matrix, 5) PA6 (polyamide 6).

The substrates were cleaned ultrasonically in isopropanol (PA) for 15 minutes and then rinsed with ethanol prior to the plasma polymerized coating trials. The substrates were then subjected to plasma polymerization of propylene on selected substrates. Propylene gas was introduced into the plasma chamber at reduced pressure. Under the influence of an externally applied electromagnetic field the propylene gas is then excited to a plasma, fragmented and deposited on the sample substrate as an ultra-thin plasma-polymerized propylene (PPP) coating. The plasma polymerization trials were performed in a small, plasma reactor.

Plasma conditions: The PPP coatings were prepared at three different plasma conditions and each type of coating was deposited on the four different substrates. Three samples of each substrate were coated at each plasma condition. The following plasma conditions were used:

| Plasma-1 (medium intensity): |
| --- |
| Precursor: propylene |
| Plasma frequency: 13.56 MHz |
| Plasma power: 150 W |
| Propylene flow: 45-55 sccm |
| Base pressure: 3-6 mtorr |
| Pressure w.Propylene: 80 mtorr |
| Pressure during plasma: 81-82 mtorr |

| Plasma-2 (low intensity): |
| --- |
| Precursor: propylene |
| Plasma frequency: 13.56 MHz |
| Plasma power: 50 W |
| Propylene flow: 45-55 sccm |
| Base pressure: 3-6 mtorr |
| Pressure w.Propylene: 80 mtorr |
| Pressure during plasma: 80-81 mtorr |

| Plasma-3 (high intensity): |
| --- |
| Precursor: propylene |
| Plasma frequency: 13.56 MHz |
| Plasma power: 250 W |
| Propylene flow: 15-20 sccm |
| Base pressure: 3-6 mtorr |
| Pressure w.Propylene: 40 mtorr |
| Pressure during plasma: 41-42 mtorr |

The plasma polymerized samples were grafted with an acrylic/vinyl monomer mixture and thereafter exposed to an alkaline palladium chloride solution which was reduced in reduction media to palladium metal. The samples were then exposed in a chemical copper. After 20 minutes had the samples been covered with a copper film layer.

The plasma-coated samples, 36 in total, were evaluated with respect to adhesion. The adhesion was tested with a tape method (percent (%) of deposit layer left) on the chemical copper film that had been participated on the plasma film.

| Material | Plasma condition | Adhesion Tape test No plasma | Adhesion Tape test Plasma |
|---|---|---|---|
| Polyclad | Plasma 1 | 15% | 100% |
| Panasonic | Plasma 1 | 20% | 100% |
| PC/ABS | Plasma 1 | Surface attack, 0% | 100% |
| GX-13 | Plasma 1 | 0% | 100% |
| PA6 | Plasma 1 | 90% | 100% |

| Material | Plasma condition | Adhesion Tape test No plasma | Adhesion Tape test Plasma |
|---|---|---|---|
| Polyclad | Plasma 2 | 15% | 100% |
| Panasonic | Plasma 2 | 20% | 100% |
| PC/ABS | Plasma 2 | Surface attack, 0% | 100% |
| GX-13 | Plasma 2 | 0% | 100% |

| Material | Plasma condition | Adhesion Tape test No plasma | Adhesion Tape test Plasma |
|---|---|---|---|
| Polyclad | Plasma 3 | 15% | 80% |
| Panasonic | Plasma 3 | 20% | 90% |
| PC/ABS | Plasma 3 | Surface attack, 0% | 100% |
| GX-13 | Plasma 3 | 0% | 70% |

Example 2

The surface energy of the PPP coating on GX13 substrate was increased by a post oxygen plasma treatment, using two different treatment times. Three replicates per condition (no post-treatment, 1 sec. O2 plasma and 5 sec. O2 plasma) were prepared for grafting tests and one sample of each condition was prepared for the wettability tests.

The following propylene plasma parameters were used:

Plasma frequency: 13.56 MHz
Plasma power: 150 W
Propylene flow: 45-55 sccm
Base pressure: 3-6 mtorr
Pressure w.Propylene: 80 mtorr
Pressure during plasma: 81-82 mtorr
Deposition time: 2 min Surface energy, expressed as Dyne Number, of PPP coatings before and after post O2 plasma treatments

| Sample | Dyne Number (mN/m) |
|---|---|
| PPP coating, no post $O_2$ plasma | 34-36 |
| PPP coating, 1 sec post $O_2$ plasma | 60-62 |
| PPP coating, 5 sec post $O_2$ plasma | 60-62 |

As shown in Table, even a very short (approximately 1 sec.) $O_2$ plasma treatment had a dramatic effect on the surface energy of the PPP coatings.

| Adhesion test | |
|---|---|
| Material | Tape adhesion test |
| GX 13 | 0% |
| PPP coating, no post $O_2$ plasma | 100% |
| PPP coating, 1 sec post $O_2$ plasma | 100% |
| PPP coating, 5 sec post $O_2$ plasma | 100% |

The adhesion with tape test is for all plasma treated GX 13 panels improved from 0% adhesion to 100% adhesion.

Example 3

Plasma-polymerized acrylic acid layers (PPA) were deposited on GX13 substrates using standard plasma conditions in one small plasma reactors. The following plasma parameters were used:

Plasma frequency: 163 kHz
Plasma power: 10 W
Acrylic acid flow: 1.6-2.0 sccm
Base pressure: 5-8 mtorr
Pressure w.Acrylic acid: 25 mtorr
Pressure during plasma: 33 mtorr
Deposition time: 2 min The plasma polymerized samples were grafted with an acrylic/vinyl monomer mixture and thereafter exposed to an alkaline palladium chloride solution which was reduced in reduction media to palladium metal. The samples were then exposed in a chemical copper. After 20 minutes had the samples been covered with a copper film layer.

| Material | Tape adhesion test | Cross hatch adhesion test |
|---|---|---|
| GX 13 | 0% | 0% |
| PPP coating, no post $O_2$ plasma | 100% | 90% |
| PPP coating, 1 sec post $O_2$ plasma | 100% | 100% |
| PPA coating | 100% | 100% |

Example 4

Plasma-polymerized ammonia layer (PPNH$_3$) were deposited on PC/ABS substrates using standard plasma conditions in a 24 liter plasma reactor Nano, from Diener Electronic, Gmbh, Germany. The following plasma parameters were used:

Plasma frequency: 40 kHz
Plasma power: 150 W (50% of max.)
Ammonia flow: 3.0-4.0 sccm
Base pressure: 0.2 mbar
Pressure w. Ammonia: 0.3 mbar
Pressure during plasma: 0.3 mbar
Deposition time: 1.5 min The plasma polymerized samples were grafted with an acrylic/vinyl monomer mixture and thereafter exposed to an alkaline palladium chloride solution which was reduced in reduction media to palladium metal. The samples were then exposed in a chemical copper. After 20 minutes had the samples been covered with a copper film layer.

| Material | Tape adhesion test | Cross hatch adhesion test |
| --- | --- | --- |
| PC/ABS | N/A | N/A |
| PPNH$_3$ coating | 100% | 100% |

Conclusion: The PC/ABS sensitivity to the grafting process chemicals is avoided by a PPNH$_3$ layer on top of it. It also shows after the plasma treatment excellent adhesion results.

Example 5

Plasma-polymerized ammonia layer (PPNH$_3$) were deposited on GX-13 substrates using standard plasma conditions in a 24 liter plasma reactor Nano, from Diener Electronic, Gmbh, Germany. The following plasma parameters were used:

```
Plasma frequency: 40 kHz
Plasma power: 150 W (50% of max.)
Ammonia flow: 3.0-4.0 sccm
Base pressure: 0.2 mbar
Pressure w. Ammonia: 0.3 mbar
Pressure during plasma: 0.3 mbar
Deposition time: 1.5 min
```

The plasma polymerized samples were grafted with an acrylic/vinyl monomer mixture and thereafter exposed to an alkaline palladium chloride solution which was reduced in reduction media to palladium metal. The samples were then exposed in a chemical copper. After 20 minutes had the samples been covered with a copper film layer.

| Material | Tape adhesion test | Cross hatch adhesion test |
| --- | --- | --- |
| GX-13 | 0% | 0% |
| PPNH$_3$ coating on GX-13 | 100% | 100% |

Conclusion: The GX-13 with a 10 nm PPNH$_3$ layer shows after the plasma treatment excellent adhesion results.

Example 6

Plasma-polymerized mixture of propane and ammonia formed a layer (PPPN) which were deposited on Polyclad substrates using standard plasma conditions in a 24 liter plasma reactor Nano, from Diener Electronic, Gmbh, Germany. The following plasma parameters were used:

```
Plasma frequency: 40 kHz
Plasma power: 225 W
Ammonia flow: 3.0-4.0 sccm
Propane Flow: 5.0 sccm
Base pressure: 0.2 mbar
Pressure w. gas mixture: 0.3 mbar
Pressure during plasma: 0.3 mbar
Deposition time: 2.0 min
```

The plasma polymerized samples were grafted with an acrylic/vinyl monomer mixture and thereafter exposed to an alkaline palladium chloride solution which was reduced in reduction media to palladium metal. The samples were then exposed in a chemical copper. After 20 minutes had the samples been covered with a copper film layer.

| Material | Tape adhesion test | Cross hatch adhesion test |
| --- | --- | --- |
| Polyclad | 15% | 20% |
| PPPN coating | 100% | 95% |

Conclusion: The Polyclad with a PPPN layer on top of it shows after the plasma treatment excellent adhesion results.

Example 7

A Plasma-polymerized 2 layer material (PP2) of a first layer (PPP=Plasma Polymer Propane) and a second layer (PPNH$_3$=Plasma-polymerized ammonia) layer on top of first layer were deposited on PC/ABS substrates using standard plasma conditions in a 24 liter plasma reactor Nano, from Diener Electronic, Gmbh, Germany. The following plasma parameters were used:

```
Plasma frequency: 40 kHz
Plasma power: 150 W (for both gases.)
Propane flow: 5.0 sccm
Ammonia flow: 3.0-4.0 sccm
Base pressure: 0.2 mbar
Pressure w. Propane: 0.3 mbar
Pressure w. Ammonia: 0.3 mbar
Pressure during plasma: 0.3 mbar
Deposition time:  2.0 min for Propane
                  1.5 min for Ammonia
```

The plasma polymerized samples were grafted with an acrylic/vinyl monomer mixture and thereafter exposed to an alkaline palladium chloride solution which was reduced in reduction media to palladium metal. The samples were then exposed in a chemical copper. After 20 minutes had the samples been covered with a copper film layer.

| Material | Cross hatch adhesion test |
| --- | --- |
| PC/ABS | N/A |
| PP2 coating | 100% |

Conclusion: The PC/ABS sensitivity to the grafting process chemicals is avoided by a PP2 layer on top of it. It also shows after the plasma treatment excellent cross hatch adhesion results.

Example 8

Plasma-polymerized ammonia layer (PPNH$_3$) were deposited on GX-13 substrates using standard plasma conditions in a 24 liter plasma reactor Nano, from Diener Electronic, Gmbh, Germany. The following plasma parameters were used:

```
Plasma frequency: 40 kHz
Plasma power: 150 W (50% of max.)
Ammonia flow: 3.0-4.0 sccm
Base pressure: 0.2 mbar
Pressure w. Ammonia: 0.3 mbar
Pressure during plasma: 0.3 mbar
Deposition time: 1.5 min
```

| Material | Tape adhesion test | Cross hatch adhesion test |
|---|---|---|
| GX-13 | 0% | 0% |
| PPNH$_3$ coating on GX-13 | 100% | 100% |

The plasma polymerized samples were grafted with an acrylic/vinyl monomer mixture and thereafter exposed colloidal palladium solution. The colloidal solution, conditioner and pre-dip were from Rohm & Haas. The chemicals from Rohm & Haas are Circuposit Conditioner 3320 Mild acidic conditioner, Circuposit Predip 3340/4400 salt predip to protect catalyst from harmful drag in and CIRCUPOSIT™ CATALYST 3344/4444 that is a colloidal palladium-tin catalyst that ensures reliable, optimum coverage and adhesion of electroless copper The samples were then exposed in a chemical copper bath. After 20 minutes had the samples been covered with a copper film layer.

Conclusion: The GX-13 with a 10 nm PPNH$_3$ layer, grafting layer, colloidal metal and copper deposition shows after the plasma treatment excellent adhesion results.

The invention claimed is:

1. A method for at least partially applying a first metal on the surface of a substrate comprising the steps:
   a) applying a polymerized coating by treating said substrate in a plasma of ammonia and propane, wherein a polymerization reaction occurs in the plasma giving the polymerized coating, and wherein the polymerized coating has a thickness of from 2 nm to 50 nm,
   b) producing polymers on the surface of said substrate by a second polymerization reaction involving at least one monomer selected from the group consisting of acrylic acid and methacrylic acid, and at least one initiator, said polymers comprising carboxylic groups and adsorbed ions of at least one second metal selected from the group consisting of ruthenium, rhodium, palladium, osmium, iridium, platinum and copper, and reducing said ions to the second metal, and
   c) depositing said first metal on said second metal, wherein said first metal is selected from the group consisting of copper, silver, gold, nickel, titanium, and chromium.

2. The method according to claim 1, wherein said coating comprises at least two layers.

3. The method according to claim 1, wherein the polymers are produced on said surface by contacting said surface with
   a) the at least one monomer,
   b) ions of the at least one second metal, and
   c) the at least one initiator.

4. The method according to claim 1, wherein the polymers are produced on said surface by contacting said surface with
   a) the at least one monomer, and
   b) the at least one initiator, and
   thereafter contacting said surface with a solution comprising ions of the at least one second metal.

5. The method according to claim 1, wherein said initiator is selected from the group consisting of thioxanthone, thioxanthone derivatives, camphorquinone, benzophenone, 4-chloro benzophenone, 4,4' dichloro benzophenone, 4-benzyl benzophenone, benzoyl naphthalene, xanthone, anthraquinone, 9-fluorenone, acetophenone, benzoyl dimethylketal, hydroxy-cyclo-hexyl-acetophenone, bi-acetyl, 3,4-hexane-di-one, 2,3-pentane-di-one, 1-phenyl-1,2-propane-di-one, benzene, benzoylformic acid, formaldehyde, acetic aldehyde, acetone, 2-pentanone, 3-pentanone, cyclohexanone, methanol sulphonate esters of benzophenone and mixtures thereof.

6. The method according to claim 1, wherein said second metal is palladium.

7. The method according to claim 6, wherein said method further comprises use of ammonium ions in step b).

8. The method according to claim 1, wherein said first metal is copper.

9. The method according to claim 1, wherein said surface is further subjected to the steps of d) selectively depositing a third metal to said surface in a distinct pattern, and e) removing said first and second metal from said surface on parts which are not covered by said third metal.

10. The method according to claim 9, wherein the third metal is copper.

11. The method according to claim 1, wherein said first metal is deposited to form a layer having a thickness of from about 0.2 μm to about 30 μm.

* * * * *